(12) United States Patent
Okamura et al.

(10) Patent No.: US 11,338,370 B2
(45) Date of Patent: May 24, 2022

(54) CUTTING TOOL AND METHOD FOR MANUFACTURING THE SAME

(71) Applicants: Sumitomo Electric Industries, Ltd., Osaka (JP); SUMITOMO ELECTRIC HARDMETAL CORP., Itami (JP)

(72) Inventors: Katsumi Okamura, Itami (JP); Satoru Kukino, Itami (JP); Makoto Setoyama, Itami (JP)

(73) Assignees: Sumitomo Electric Industries, Ltd., Osaka (JP); Sumitomo Electric Hardmetal Corp., Itami (JP)

( * ) Notice: Subject to any disclaimer, the term of this patent is extended or adjusted under 35 U.S.C. 154(b) by 0 days.

(21) Appl. No.: 16/070,832

(22) PCT Filed: Dec. 14, 2017

(86) PCT No.: PCT/JP2017/044829
§ 371 (c)(1),
(2) Date: Jul. 18, 2018

(87) PCT Pub. No.: WO2018/198421
PCT Pub. Date: Nov. 1, 2018

(65) Prior Publication Data
US 2019/0247927 A1    Aug. 15, 2019

(30) Foreign Application Priority Data

Apr. 25, 2017   (JP) .............................. JP2017-085897

(51) Int. Cl.
*B23B 27/14* (2006.01)
*C04B 35/5831* (2006.01)
(Continued)

(52) U.S. Cl.
CPC .............. *B23B 27/14* (2013.01); *B23B 51/00* (2013.01); *B23C 5/16* (2013.01); *C04B 35/5831* (2013.01);
(Continued)

(58) Field of Classification Search
CPC ................ B23B 27/14; C23C 14/5883; C23C 30/005; B23C 5/16; C04B 35/5831
(Continued)

(56) References Cited

U.S. PATENT DOCUMENTS 6,599,062 B1   7/2003   Oles et al.
2002/0168552 A1* 11/2002 Yamamoto .......... C23C 14/0641
                                                    428/697

(Continued)

FOREIGN PATENT DOCUMENTS

EP   1932816 A1   6/2008
EP   2446066 A1   5/2012
(Continued)

OTHER PUBLICATIONS

Fukunaga et al., JP 2011/224768 A, machine translation, Nov. 10, 2011, entire translation (Year: 2011).*
(Continued)

*Primary Examiner* — Humera N. Sheikh
*Assistant Examiner* — Katherine A Christy
(74) *Attorney, Agent, or Firm* — Baker Botts L.L.P.; Michael A. Sartori

(57) ABSTRACT

A cutting tool includes a base material, and a coating film covering the base material in contact with the base material. The base material is a cubic boron nitride sintered material. The coating film is a ceramic. An amount of oxygen in the coating film is less than or equal to 0.040 mass percent.

3 Claims, 1 Drawing Sheet

(51) Int. Cl.
*B23C 5/16* (2006.01)
*B23B 51/00* (2006.01)
*C23C 30/00* (2006.01)

(52) U.S. Cl.
CPC ............ *C23C 30/00* (2013.01); *C23C 30/005* (2013.01); *B23B 2224/08* (2013.01); *B23B 2224/32* (2013.01); *B23B 2224/36* (2013.01); *B23B 2226/125* (2013.01); *B23B 2228/10* (2013.01); *B23C 2226/125* (2013.01); *B23C 2228/10* (2013.01)

(58) Field of Classification Search
USPC ........................................................ 428/704
See application file for complete search history.

(56) References Cited

U.S. PATENT DOCUMENTS

2016/0114400 A1    4/2016  Tsukihara et al.
2017/0145556 A1*   5/2017  Andersson ............ C23C 28/044

FOREIGN PATENT DOCUMENTS

| EP | 3061738 A1 | | 8/2016 |
| JP | 07-097677 A | | 4/1995 |
| JP | 08-119774 A | | 5/1996 |
| JP | 2001-220268 A | | 8/2001 |
| JP | 2001-353603 A | | 12/2001 |
| JP | 2006281362 A | * | 4/2006 |
| JP | 2011-224768 A | | 11/2011 |
| JP | 2011224768 A | * | 11/2011 |
| JP | 2015-085465 A | | 5/2015 |
| KR | 10-2016-0028409 A | | 3/2016 |
| WO | 2010/140959 A1 | | 12/2010 |

OTHER PUBLICATIONS

Meijers, "Impurities in Aluminium", Jul. 7, 2010, University of Liverpool, European Aluminium Association, pp. 1-2 (Year: 2010).*
JP 2006281362 A , machine translation, Oct. 19, 2006, entire translation (Year: 2006).*

* cited by examiner

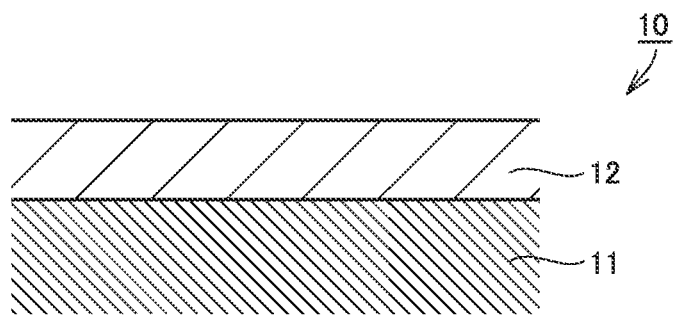

CUTTING TOOL AND METHOD FOR MANUFACTURING THE SAME

TECHNICAL FIELD

The present invention relates to a cutting tool and a method for manufacturing the same. The present application claims priority based on Japanese Patent Application No. 2017-085897 filed on Apr. 25, 2017, the entire content of which is incorporated herein by reference.

BACKGROUND ART

Conventionally, cutting tools using a cubic boron nitride (hereinafter also referred to as "cBN") sintered material as a base material have been known. For example, Japanese Patent Laying-Open No. 08-119774 (PTD 1) discloses a high-hardness composite material for tools having a heat-resistant hard coating film made of a ceramic such as TiAlCN on a surface of a base material that is a cBN sintered material. Japanese Patent Laying-Open No. 2001-220268 (PTD 2), Japanese Patent Laying-Open No. 2001-353603 (PTD 3), and Japanese Patent Laying-Open No. 2015-085465 (PTD 4) also disclose a cutting tool having a ceramic coating film formed on a surface of a base material that is a cBN sintered material.

CITATION LIST

Patent Document

PTD 1: Japanese Patent Laying-Open No. 08-119774
PTD 2: Japanese Patent Laying-Open No. 2001-220268
PTD 3: Japanese Patent Laying-Open No. 2001-353603
PTD 4: Japanese Patent Laying-Open No. 2015-085465

SUMMARY OF INVENTION

Technical Problem

A cutting tool in accordance with one aspect of the present disclosure includes a base material, and a coating film covering the base material in contact with the base material. The base material is a cubic boron nitride sintered material. The coating film is a ceramic. An amount of oxygen in the coating film is less than or equal to 0.040 mass percent.

A method for manufacturing a cutting tool in accordance with one aspect of the present disclosure includes: a first step of placing a base material that is a cubic boron nitride sintered material within a chamber, emitting inert gas ions onto a surface of the base material, and thereby cleaning the surface of the base material; and a second step of forming a ceramic coating film on the surface of the base material placed within the chamber using a physical vapor deposition method, after the first step. In the first step and the second step, a total partial pressure of an oxygen partial pressure and a water partial pressure within the chamber is less than or equal to $5 \times 10^{-3}$ Pa.

BRIEF DESCRIPTION OF DRAWINGS

FIG. 1 is a partial cross sectional view showing one example of a configuration of a cutting tool in accordance with the present embodiment.

DESCRIPTION OF EMBODIMENTS

Problem to be Solved by the Present Disclosure

In recent years, the demand for highly efficient machining and highly precise machining on steel, hardened steel, or difficult-to-cut cast steel has been increasing. However, with a conventional cutting tool, a coating film easily peels off when cutting such a workpiece, and excellent machining precision cannot be obtained.

In view of the above circumstance, the present disclosure provides a cutting tool having a coating film excellent in peeling resistance, and a method for manufacturing the same.

Effect of Present Disclosure

According to the above, a cutting tool having a coating film excellent in peeling resistance can be provided.

Description of Embodiment of the Present Invention

First, an embodiment of the present invention will be described in list form. It should be noted that, in the present specification, the expression "M to N" represents a lower limit and an upper limit of a range (i.e., more than or equal to M and less than or equal to N). When no unit is indicated for M and a unit is indicated only for N, the unit of M is the same as the unit of N.

The present inventor focused attention on the fact that a trace amount of oxygen in an interface between a base material and a coating film causes a reduction in adhesion force between the base material and the coating film. As a result of earnest studies, the inventor has found that the coating film becomes less likely to peel off by defining the amount of oxygen in the coating film in contact with the base material, and completed the cutting tool in accordance with the present disclosure.

[1] A cutting tool in accordance with the present disclosure includes a base material, and a coating film covering the base material in contact with the base material. The base material is a cubic boron nitride sintered material. The coating film is a ceramic. An amount of oxygen in the coating film is less than or equal to 0.040 mass percent. With the cutting tool described above, a reduction in adhesion resulting from oxygen in the interface between the base material and the coating film can be suppressed. Thereby, adhesion between the base material and the coating film is improved, and peeling resistance of the coating film is improved.

[2] In the cutting tool described above, the amount of oxygen in the coating film is less than or equal to 0.010 mass percent. Thereby, the adhesion between the base material and the coating film is further improved, and strength of the coating film is improved.

[3] In the cutting tool described above, the cubic boron nitride sintered material is composed of more than or equal to 30 volume percent and less than or equal to 90 volume percent of cubic boron nitride, and a remainder including a binder. The binder is composed of at least one selected from a compound and a solid solution thereof, at least one of Al and an Al compound, and inevitable impurities, the compound being composed of at least one element selected from elements in groups 4, 5, and 6 of a periodic table and Si, and at least one selected from N, C, B, and O. The coating film has a thickness of more than or equal to 0.05 μm and less than or equal to 5 μm. The ceramic includes at least one compound composed of at least one element selected from the elements in groups 4, 5, and 6 of the periodic table, Al, and Si, and at least one selected from C and N.

With the composition of the base material described above, at least one of Al and the Al compound increases a binding force between cBN particles, and improves toughness and strength of the cBN sintered material. Further, since the binder includes at least one selected from a compound and a solid solution thereof, the compound being composed of at least one element selected from the elements in groups 4, 5, and 6 of the periodic table and Si, and at least one selected from N, C, B, and O, strength and wear resistance of the base material are improved.

Furthermore, with the thickness of the coating film described above, the adhesion with the base material can be further improved, and excellent productivity is achieved. With the composition of the coating film described above, a coating film having a high hardness and an excellent wear resistance is obtained.

[4] A method for manufacturing a cutting tool in accordance with the present disclosure includes: a first step of placing a base material that is a cubic boron nitride sintered material within a chamber, emitting inert gas ions generated within the chamber onto a surface of the base material, and thereby cleaning the surface of the base material; and a second step of forming a ceramic coating film on the surface of the base material placed within the chamber using a PVD method, after the first step. In the first step and the second step, a total partial pressure of an oxygen partial pressure and a water partial pressure within the chamber is less than or equal to $5 \times 10^{-3}$ Pa.

With the manufacturing method described above, a coating film in which the amount of oxygen is less than or equal to 0.040 mass percent can be easily formed, and the amount of oxygen in the interface between the coating film and the base material can be reduced. Thereby, adhesion between the base material and the coating film is improved, and peeling resistance of the coating film is improved.

[5] In the first step and the second step, the total partial pressure of the oxygen partial pressure and the water partial pressure within the chamber is less than or equal to $6 \times 10^{-4}$ Pa. Thereby, the amount of oxygen in the coating film can be further reduced, and the adhesion between the base material and the coating film is further improved. In addition, since the amount of low-strength amorphous oxygen in the coating film is reduced, strength of the coating film is improved.

[6] In the first step and the second step, the oxygen partial pressure within the chamber is less than or equal to $1 \times 10^{-15}$ Pa. Thereby, the adhesion between the base material and the coating film is further improved. In addition, since the amount of low-strength amorphous oxygen in the coating film is reduced, strength of the coating film is further improved.

Details of Embodiment of the Present Invention

One embodiment of the present invention (hereinafter referred to as the "present embodiment") will be described below, although the present embodiment is not limited to the description below. It should be noted that, in the drawings used for describing the embodiment below, identical reference characters denote identical or corresponding parts. In addition, in a case where a compound or the like is expressed by a chemical formula in the present specification, when an atomic ratio is not particularly limited, it is assumed that any conventionally known atomic ratio is included. The atomic ratio is not necessarily limited to one within a stoichiometric range. For example, when "AlCrN" is described, the ratio of the numbers of atoms constituting AlCrN is not limited to Al:Cr:N=0.5:0.5:1, and any conventionally known atomic ratio is included.

<Cutting Tool>

FIG. 1 is a partial cross sectional view showing one example of a configuration of a cutting tool in accordance with the present embodiment. As shown in FIG. 1, a cutting tool 10 includes a base material 11, and a coating film 12 covering base material 11 in contact with base material 11. Preferably, coating film 12 covers entire base material 11. However, even when coating film 12 does not cover a portion of base material 11 or even when coating film 12 has a partially different configuration, such coating film 12 does not depart from the scope of the present invention.

The shape and use of cutting tool 10 are not particularly limited. Examples of cutting tool 10 can include a drill, an end mill, an indexable cutting insert for drill, an indexable cutting insert for end mill, an indexable cutting insert for milling, an indexable cutting insert for turning, a metal saw, a gear cutting tool, a reamer, a tap, a tip for crankshaft pin milling, and the like.

Cutting tool 10 is not limited to a cutting tool which entirely has the above configuration including base material 11 and coating film 12 formed on base material 11, but also includes a cutting tool which has the above configuration only partially (in particular, at a cutting edge portion (cutting blade portion) or the like). For example, a cutting tool in which only a cutting edge portion of a base (support) composed of cemented carbide or the like has the above configuration is also included in the cutting tool in accordance with the present embodiment. In this case, literally, the cutting edge portion is regarded as a cutting tool. In other words, even when the above configuration accounts for only a portion of a cutting tool, the above configuration is referred to as a cutting tool.

<<Base Material>>

Base material 11 is a cBN sintered material composed of cBN and a binder. The cBN sintered material is composed of, for example, 30 to 90 volume percent of cBN, and a remainder including the binder.

The content ratio (in volume percent) of cBN in base material 11 can be achieved by setting the volume percent of cBN powder used when manufacturing the cBN sintered material that is base material 11, to be within the range described above. The content ratio can also be checked by performing texture observation, elemental analysis, and the like on base material 11 using quantitative analysis by means of inductively-coupled high-frequency plasma spectrometry (ICP), an energy dispersive X-ray analyzer (EDX) attached to a scanning electron microscope (SEM), or an EDX attached to a transmission electron microscope (TEM).

For example, in a case where an SEM is used, the content ratio (in volume percent) of cBN can be determined as described below. First, cutting tool 10 is cut at an arbitrary position to fabricate a sample including a cross section of base material 11. To fabricate the cross section of base material 11, a focused ion beam device, a cross section polisher device, and the like can be used. Then, the cross section of the cubic boron nitride sintered material is observed with the SEM at a magnification of 2000 to obtain a reflected electron image. In the reflected electron image, a region where cubic boron nitride particles exist appears as a black region, and a region where the binder exists appears as a gray region or a white region.

Then, binarization processing is performed on the reflected electron image using image analysis software (for example, "WinROOF" manufactured by Mitani Corporation), and each area ratio is calculated from the image subjected to the binarization processing. By considering the calculated area ratio as a volume percent, the content ratio (in volume percent) of cBN can be determined. Thereby, the volume percent of the binder can be determined simultaneously.

Preferably, the binder is composed of at least one selected from a compound and a solid solution thereof, at least one of Al and an Al compound (for example, a nitride, a boride, an oxide thereof), and inevitable impurities resulting from raw materials to be used, manufacturing conditions, and the like, the compound being composed of at least one element selected from elements in group 4 (such as Ti, Zr, Hf), elements in group 5 (such as V, Nb, Ta), and elements in group 6 (such as Cr, Mo, W) of a periodic table and Si, and at least one selected from N, C, B, and O. Such a binder reacts with cBN during sintering under high temperature and high pressure, and compounds such as aluminum boride ($AlB_2$) and aluminum nitride (AlN) are generated in an interface between cBN particles and the binder, increasing the binding force between the particles and improving toughness and strength of the sintered material. In addition, since Al and an Al compound are included in the binder, peeling resistance of cutting tool 10 can be improved. Specific examples of the Al compound include AlCrN, AlN, $Al_2O_3$, and the like.

The types and content ratios (in mass percent) of the compounds included in the binder can be specified as described below. First, a sample including the cross section of the cBN sintered material is fabricated according to the technique of determining the content ratio of cBN described above. Then, the types and content ratios of elements are calculated using an energy dispersive X-ray analyzer (EDX) attached to an SEM or a TEM. Subsequently, the types and respective content ratios of the compounds are estimated using an X-ray diffractometer, and the content ratio of each compound is calculated from these results.

<<Coating Film>>

Coating film 12 is formed immediately above base material 11, and covers base material 11 in contact with base material 11. The amount of oxygen atoms (O) (hereinafter also referred to as the "amount of oxygen") in coating film 12 is less than or equal to 0.040 mass percent, preferably less than or equal to 0.010 mass percent, and further preferably less than or equal to 0.005 mass percent, including an interface with base material 11. It should be noted that a lower limit of the amount of oxygen in the coating film is not particularly limited, and is ideally 0 mass percent. However, when the amount of oxygen is less than 0.001 mass percent, it becomes difficult and costly to manufacture such a coating film.

The amount of oxygen in coating film 12 is calculated by emitting X rays onto a surface of coating film 12 using an energy dispersive X-ray analyzer (EDX), and analyzing the mass of each element in a region at least from the surface of coating film 12 to the interface between coating film 12 and base material 11 (detection depth: 0.1 to 5 μm). The detection depth depends on the accelerating voltage in the EDX and the composition of coating film 12. For example, when the composition of coating film 12 is TiAlN and the accelerating voltage in the EDX is 15 eV, the detection depth is about 2 μm. Accordingly, the accelerating voltage in the EDX can be set according to the thickness of coating film 12, such that the detection depth becomes substantially equal to a distance from the surface of coating film 12 to the interface between coating film 12 and base material 11. It should be noted that the amount of oxygen in a surface of base material 11 also influences an adhesion force between base material 11 and coating film 12. Accordingly, the detection depth may be set such that detection is also performed in a portion of base material 11 in the vicinity of the interface with coating film 12. That is, the accelerating voltage in the EDX can be set such that the detection depth becomes more than or equal to the distance from the surface of coating film 12 to the interface between coating film 12 and base material 11.

On the surface of base material 11, microscopic asperities exist due to a bombardment step described later. It is considered that adhesion between base material 11 and coating film 12 is achieved by an anchor effect obtained when components of coating film 12 enter the asperities and crystallize thereon. It is estimated that oxygen in the interface between base material 11 and coating film 12 exists in an amorphous state having a significantly low strength. Such amorphous oxygen can be a starting point of a fracture and cause peeling of coating film 12 accompanied by microfractures. Thus, the adhesion force between base material 11 and coating film 12 is likely to be reduced. However, by defining the amount of oxygen in coating film 12 as described above, a reduction in adhesion between base material 11 and coating film 12 resulting from oxygen can be suppressed, and peeling resistance of coating film 12 can be improved. In addition, since microfractures starting from amorphous oxygen become less likely to be produced by reducing the amount of oxygen in coating film 12, strength of coating film 12 is improved. By improving the strength of coating film 12, peeling of coating film 12 resulting from accumulation of microfractures can be suppressed.

Coating film 12 is a hard ceramic. The ceramic includes at least one compound composed of at least one element selected from the elements in groups 4, 5, and 6 of the periodic table, Al, and Si, and at least one selected from C and N. Examples of the compound can include TiN, AlN, CrN, TiSiN, ZrN, AlZrN, TiAlN, TiAlSiN, TiAlCrSiN, AlCrN, AlCrSiN, TiZrN, TiAlMoN, TiAlNbN, AlCrTaN, AlTiVN, TiCrHfN, CrSiWN, AlHfN, TiAlWN, ZrSiN, TiCN, TiBN, TiCBN, TiAlCN, AlCN, AlCrCN, CrCN, TiSiCN, ZrCN, AlCrMoCN, AlTiVCN, and the like.

By selecting the compound as described above as coating film 12, coating film 12 has an improved hardness and an improved wear resistance. Further, as the wear resistance of coating film 12 is improved, cutting resistance is less likely to be increased, peeling of the coating film is less likely to occur, and wear is less likely to progress. In addition, undulation is less likely to occur during machining, and the machining can be performed with high dimensional accuracy, improving life.

Preferably, the coating film has a thickness of 0.05 to 5 μm. By setting the thickness of the coating film to be within that range, both adhesion with the base material and wear resistance are achieved at a high level, and as a result, excellent productivity is achieved.

It should be noted that one, two or more layers of thin films may be formed, as a second coating film, on the surface of coating film 12. Examples of such a thin film include a film made of any of nitrides, carbides, carbonitrides, and oxides of the elements in group 4.

<Method for Manufacturing Cutting Tool>

The method for manufacturing the cutting tool in the present embodiment is a method for manufacturing the cutting tool described above, including: a first step (bombardment step) of placing a base material that is a cBN sintered material within a chamber of a PVD (Physical Vapor Deposition) device, emitting inert gas ions onto a surface of the base material, and thereby cleaning the surface of the base material; and a second step (film formation step) of forming a ceramic coating film on the surface of the base material placed within the chamber using a physical vapor deposition method (PVD method), after the first step. In the first step and the second step, a total partial pressure of an oxygen partial pressure and a water partial pressure within the chamber is less than or equal to $5\times10^{-3}$ Pa. Each step will be described below in detail.

<<First Step (Bombardment Step)>>

A base material that is a cBN sintered material is placed within a chamber of a commercially available PVD device. A vacuum pump is connected to the chamber, and the pressure inside the chamber is reduced. Further, a gas partial pressure control device is connected to the chamber, and an oxygen partial pressure and a water partial pressure within the chamber are controlled. As the gas partial pressure control device, known gas purification device, oxygen partial pressure control device, and the like can be used.

The base material is fabricated using a known method. For example, the base material is fabricated by sintering, under high temperature and high pressure, a mixture composed of cBN particles and raw powder of a binder and adjusted such that the mixing ratio of the cBN particles becomes more than or equal to 30 volume percent and less than or equal to 90 volume percent.

After the base material is placed within the chamber, the chamber is vacuumized by the vacuum pump, the gas partial pressure control device is operated, and waiting is performed until a total partial pressure of the oxygen partial pressure and the water partial pressure within the chamber reaches a first set value that is less than or equal to $5\times10^{-3}$ Pa.

After the total partial pressure of the oxygen partial pressure and the water partial pressure within the chamber reaches the first set value, an inert gas (for example, Ar gas) is introduced into the chamber to generate inert gas ions by plasma discharge, and a negative high voltage (for example, $-1000$ V) is applied to the base material. Thereby, the inert gas ions are emitted onto a surface of the base material, and the surface of the base material is cleaned. On this occasion, the oxygen partial pressure and the water partial pressure within the chamber are monitored, and when the total partial pressure of the oxygen partial pressure and the water partial pressure becomes less than or equal to the first set value, connection between the gas partial pressure control device and the chamber is cut off. As a result, the total partial pressure of the oxygen partial pressure and the water partial pressure within the chamber is stabilized at less than or equal to the first set value.

<<Second Step (Film Formation Step)>>

Next, the vacuum pump is operated to exhaust the inert gas from the chamber. Then, the gas partial pressure control device is operated, and waiting is performed until the total partial pressure of the oxygen partial pressure and the water partial pressure within the chamber reaches a second set value that is less than or equal to $5\times10^{-3}$ Pa. It should be noted that the second set value may be the same as or different from the first set value.

After the total partial pressure of the oxygen partial pressure and the water partial pressure within the chamber reaches the second set value, a coating film is formed on the surface of the base material by a physical vapor deposition method. As the physical vapor deposition method, any of conventionally known methods (an arc ion plating method, a sputtering method, and the like) can be adopted. Further, the coating film may be formed by introducing a reactive gas (for example, $N_2$ gas) into the chamber and causing the reactive gas to chemically react with a vaporized gas of a target.

The thickness of the coating film is controlled by film formation time. The composition of the coating film is adjusted by the composition of a raw material serving as the target and the reactive gas.

During film formation, the oxygen partial pressure and the water partial pressure within the chamber are monitored, and when the total partial pressure of the oxygen partial pressure and the water partial pressure becomes less than or equal to the second set value, connection between the gas partial pressure control device and the chamber is cut off. Thereby, the total partial pressure of the oxygen partial pressure and the water partial pressure within the chamber is stabilized at less than or equal to the second set value.

As described above, in the bombardment step, the total partial pressure of the oxygen partial pressure and the water partial pressure within the chamber is maintained at less than or equal to $5\times10^{-3}$ Pa. Thereby, the amount of oxygen in the surface of the base material can be reduced. Also in the subsequent film formation step, the total partial pressure of the oxygen partial pressure and the water partial pressure within the chamber is maintained at less than or equal to $5\times10^{-3}$ Pa. As a result, the amount of oxygen in the coating film including the interface with the base material becomes less than or equal to 0.040 mass percent, a reduction in adhesion between the coating film and the base material resulting from oxygen can be suppressed, and peeling resistance of the coating film can be improved. Further, since the adhesion between the coating film and the base material is improved, the cutting tool can have a longer life. Although a lower limit of the total partial pressure of the oxygen partial pressure and the water partial pressure within the chamber is not particularly limited and is ideally 0 Pa, it is preferably set as low as possible in a range controllable by normal operation of the gas partial pressure control device, taking manufacturing cost into consideration.

It should be noted that, in the bombardment step and the film formation step, the total partial pressure of the oxygen partial pressure and the water partial pressure within the chamber is preferably maintained at less than or equal to $6\times10^{-4}$ Pa. Thereby, the amount of oxygen in the coating film can be further reduced (for example, to less than or equal to 0.010 mass percent), and the adhesion between the coating film and the base material can be further improved. Furthermore, in the bombardment step and the film formation step, the oxygen partial pressure within the chamber is more preferably maintained at less than or equal to $1\times10^{-15}$ Pa. Thereby, the amount of oxygen in the coating film can be further reduced (for example, to less than or equal to 0.005 mass percent), and the adhesion between the coating film and the base material can be further improved.

Examples

The present invention will be described in more detail below with reference to Examples, although the present invention is not limited thereto. Cutting tools of sample Nos. 1 to 3, 5, and 6 each include the coating film described above. Cutting tools of sample Nos. 4 and 7 are comparative examples.

<Fabrication of Cutting Tools of Sample Nos. 1 to 3>

<<Bombardment Step>>

A commercially available cBN sintered material tool having the shape of CNGA120408 under the ISO standard ("BNX20" manufactured by Sumitomo Electric Industries, Ltd.) was placed within a chamber of an arc ion plating-type PVD device. The cBN sintered material tool included 60 volume percent of cBN. Further, the cBN sintered material tool included TiN and Al as a binder.

In a pipe between the chamber and a vacuum pump, a gas purification device ("Puremate 1100" manufactured by TAIYO NIPPON SANSO CORPORATION) was placed. The gas purification device is a device for removing oxygen and water within a chamber by means of a filter which uses a catalyst and an adsorbent. Then, by operating the vacuum pump and the gas purification device, the chamber was evacuated to a vacuum, and waiting was performed until the degree of vacuum within the chamber reached less than or equal to $10^{-4}$ Pa, an oxygen partial pressure within the chamber reached A Pa, and a water partial pressure within the chamber reached B Pa. Thereafter, Ar gas was introduced into the chamber, and a voltage of −1000 V was applied to the cBN sintered material tool in an atmosphere of 2 Pa to clean a surface of the cBN sintered material tool. When the oxygen partial pressure within the chamber reached A Pa and the water partial pressure within the chamber reached B Pa, the purification function by the gas purification device was stopped, such that the oxygen partial pressure within the chamber was stabilized at A Pa and the water partial pressure within the chamber was stabilized at B Pa during cleaning. Specifically, the filter of the gas purification device was removed.

<<Film Formation Step>>

Next, the inside of the chamber was heated to 500° C. to exhaust the Ar gas. Then, $N_2$ gas as a reactive gas was introduced into the chamber at a flow rate of 300 cm$^3$/minute, the gas purification device was operated, and waiting was performed until the oxygen partial pressure within the chamber reached C Pa and the water partial pressure within the chamber reached D Pa. When the oxygen partial pressure within the chamber reached C Pa and the water partial pressure within the chamber reached D Pa, the purification function by the gas purification device was stopped to maintain the oxygen partial pressure within the chamber at C Pa and maintain the water partial pressure within the chamber at D Pa. Thereafter, a voltage of −35 V was applied to the cBN sintered material tool, a target made of a TiAl alloy (having a composition ratio between Ti and Al of 1:1) was vaporized and ionized by vacuum arc discharge (arc current: 100 A) to cause the $N_2$ gas to react with the vaporized gas, thereby forming a coating film of TiAlN on the surface of the cBN sintered material tool.

It should be noted that the oxygen partial pressure and the water pressure in the bombardment step and the film formation step were measured using the "Quadrupole Type Mass Spectrometer" manufactured by Canon ANELVA Corporation. The cutting tools of sample Nos. 1 to 3 were fabricated using different gas partial pressures A, B, C, and D described above.

<Fabrication of Cutting Tool of Sample No. 4>

The cutting tool of sample No. 4 was fabricated by the same method as that for sample Nos. 1 to 3, except that the gas purification device was not used. That is, the cutting tool of sample No. 4 was fabricated with an oxygen partial pressure and a water partial pressure within the chamber being higher than those for sample Nos. 1 to 3.

<Fabrication of Cutting Tools of Sample Nos. 5 and 6>

<<Bombardment Step>>

The same cBN sintered material tool as sample Nos. 1 to 4 was placed within the chamber of the arc ion plating-type PVD device. The vacuum pump and an oxygen partial pressure control device ("SiOC-200C" manufactured by STLab Co., Ltd.) were connected to the chamber using respective different pipes. A valve was provided to the pipe connecting the chamber and the oxygen partial pressure control device. The oxygen partial pressure control device is a device capable of controlling an oxygen partial pressure to be lower, when compared with the gas purification device described above. Then, by operating the vacuum pump and the oxygen partial pressure control device, the chamber was evacuated to a vacuum, and waiting was performed until the degree of vacuum within the chamber reached less than or equal to $10^{-4}$ Pa, an oxygen partial pressure within the chamber reached A Pa, and a water partial pressure within the chamber reached B Pa. Thereafter, Ar gas was introduced into the chamber, and a voltage of −1000 V was applied to the cBN sintered material tool in an atmosphere of 2 Pa to clean a surface of the cBN sintered material tool. When the oxygen partial pressure within the chamber reached A Pa and the water partial pressure within the chamber reached B Pa, the valve between the oxygen partial pressure control device and the chamber was closed, such that the oxygen partial pressure within the chamber was stabilized at A Pa and the water partial pressure within the chamber was stabilized at B Pa during cleaning.

<<Film Formation Step>>

Next, the inside of the chamber was heated to 500° C. to exhaust the Ar gas. Then, $N_2$ gas as a reactive gas was introduced into the chamber at a flow rate of 300 cm$^3$/minute, the oxygen partial pressure control device was operated, and waiting was performed until the oxygen partial pressure within the chamber reached C Pa and the water partial pressure within the chamber reached D Pa. When the oxygen partial pressure within the chamber reached C Pa and the water partial pressure within the chamber reached D Pa, the valve between the oxygen partial pressure control device and the chamber was closed to maintain the oxygen partial pressure within the chamber at C Pa and maintain the water partial pressure within the chamber at D Pa. Thereafter, a voltage of −35 V was applied to the cBN sintered material tool, a target made of an AlCr alloy (having a composition ratio between Al and Cr of 1:1) was vaporized and ionized by vacuum arc discharge (arc current: 100 A) to cause the $N_2$ gas to react with the vaporized gas, thereby forming a coating film of AlCrN on the surface of the cBN sintered material tool.

It should be noted that the oxygen partial pressure and the water pressure in the bombardment step and the film formation step were measured using the "Quadrupole Type Mass Spectrometer" manufactured by Canon ANELVA Corporation. The cutting tools of sample Nos. 5 and 6 were fabricated using different gas partial pressures A, B, C, and D described above.

<Fabrication of Cutting Tool of Sample No. 7>

The cutting tool of sample No. 7 was fabricated by the same method as that for sample Nos. 5 and 6, except that the oxygen partial pressure control device was not used. That is, the cutting tool of sample No. 7 was fabricated with an oxygen partial pressure and a water partial pressure within the chamber being higher than those for samples No. 5 and 6.

<Method for Measuring Film Thickness>

A fracture surface in each of the cutting tools of sample Nos. 1 to 7 was imaged using a scanning electron microscope ("JSM-7800F" manufactured by JEOL Ltd.), the thickness of the coating film was measured at five positions in the vicinity of a cutting edge, and an average value thereof was calculated.

<Method for Measuring Amount of Oxygen in Coating Film>

An energy dispersive X-ray analyzer ("Pegasus" manufactured by AMETEK Co., Ltd.) was used to emit X rays onto a surface of the coating film and measure a percentage by mass of the amount of oxygen in the coating film. The energy dispersive X-ray analyzer performed measurement under the condition of an accelerating voltage of 15 eV. Further, the amount of oxygen was measured at five positions in the surface of the coating film, and an average value thereof was calculated.

<Cutting Test Method>

A cycle of cutting a workpiece using each of the cutting tools of sample Nos. 1 to 7 for 0.5 seconds according to cutting conditions described below and then detaching the cutting tool from the workpiece for one second was repeated 640 times (equivalent to a cutting distance of 0.8 km). Then, a reflected electron image of a flank of the cutting tool was imaged using the scanning electron microscope ("JSM-7800F" by JEOL Ltd.), and an area of a peeling region (hereinafter referred to as a peeling area) was calculated using image analysis software ("WinROOF" manufactured by Mitani Corp.). Further, the above cycle was repeated until the peeling area exceeded 5000 $\mu m^2$, and a cutting distance obtained when the peeling area reached 5000 $\mu m^2$ was calculated as a life distance. Specifically, in a graph having the axis of abscissas representing the cutting distance and the axis of ordinates representing the peeling area, a point of intersection between a straight line connecting a point of origin and a point where the peeling area exceeded 5000 $\mu m^2$ and a straight line indicating the peeling area of 5000 $\mu m^2$ was specified, and a cutting distance at the specified point of intersection was determined as a life distance.

<<Cutting Conditions>>

Workpiece: Carburized and quenched steel (SCM415H, hardness HRC 60)

Cutting speed: Vc=150 m/minute

Feed rate: f=0.2 mm/rev

Cut: ap=0.2 mm

Cutting oil: used (wet state).

<Results>

Table 1 shows measurement results of oxygen partial pressure A and water partial pressure B in the bombardment step, oxygen partial pressure C and water partial pressure D in the film formation step, the thickness of the coating film, the amount of oxygen in the coating film, the peeling area at the cutting distance of 0.8 km, and the life distance, for each of the cutting tools of sample Nos. 1 to 7.

In the cutting tools of sample Nos. 1 to 3, 5, and 6, it was confirmed that the peeling area at the cutting distance of 0.8 km was suppressed to less than 2000 $\mu m^2$, the life distance was more than or equal to 1.8 km, and thus the coating film had an excellent peeling resistance. This is considered to be because the adhesion between the base material and the coating film was improved in sample Nos. 1 to 3, 5, and 6, as the total partial pressure of the oxygen partial pressure and the water partial pressure in each of the bombardment step and the film formation step was limited to less than or equal to $5\times10^{-3}$ Pa and the amount of oxygen in the coating film was less than or equal to 0.040 mass percent.

In contrast, in the cutting tools of sample Nos. 4 and 7, since the total partial pressure of the oxygen partial pressure and the water partial pressure in each of the bombardment step and the film formation step exceeded $5\times10^{-3}$ Pa, the amount of oxygen in the coating film was more than or equal to 0.050 mass percent. Accordingly, it was confirmed that the adhesion between the base material and the coating film was reduced, and the life distance was as short as less than 1.0 km.

Furthermore, in sample Nos. 2, 5, and 6, the total partial pressure of the oxygen partial pressure and the water partial pressure in each of the bombardment step and the film formation step was limited to less than or equal to $6\times10^{-4}$ Pa, and the amount of oxygen in the coating film was less than or equal to 0.010 mass percent. Thereby, it was confirmed that the adhesion between the base material and the coating film was further improved, the peeling area at the cutting distance of 0.8 km was suppressed to less than 350 $\mu m^2$, and the life distance was more than or equal to 2.5 km. Accordingly, it was confirmed that the total partial pressure of the oxygen partial pressure and the water partial pressure in each of the bombardment step and the film formation step is preferably less than or equal to $6\times10^{-4}$ Pa, and that the amount of oxygen in the coating film is preferably less than or equal to 0.010 mass percent.

Particularly in sample Nos. 5 and 6, the oxygen partial pressure in each of the bombardment step and the film formation step was limited to as low as less than or equal to $1\times10^{-15}$ Pa, and the amount of oxygen in the coating film was less than or equal to 0.005 mass percent. Thereby, it was confirmed that the adhesion between the base material and the coating film was further improved, the peeling area at the cutting distance of 0.8 km was suppressed to less than 130 $\mu m^2$, and the life distance was more than or equal to 2.9 km. Accordingly, it was confirmed that the oxygen partial pressure in each of the bombardment step and the film formation step is preferably less than or equal to $1\times10^{-15}$ Pa, and that the amount of oxygen in the coating film is more preferably less than or equal to 0.005 mass percent.

TABLE 1

| | Bombardment Step | | | Film Formation Step | | | | Amount of | Cutting Test | |
| --- | --- | --- | --- | --- | --- | --- | --- | --- | --- | --- |
| No. | Oxygen Partial Pressure A (Pa) | Water Partial Pressure B (Pa) | A + B (Pa) | Oxygen Partial Pressure C (Pa) | Water Partial Pressure D (Pa) | C + D (Pa) | Film Thickness ($\mu m$) | Oxygen in Coating Film (mass %) | Peeling Area at Cutting Distance of 0.8 km ($\mu m^2$) | Life Distance (km) |
| 1 | $2\times10^{-3}$ | $2\times10^{-3}$ | $4\times10^{-3}$ | $2\times10^{-3}$ | $2\times10^{-3}$ | $4\times10^{-3}$ | 2 | 0.021 | 1658 | 2.2 |
| 2 | $1\times10^{-4}$ | $5\times10^{-4}$ | $6\times10^{-4}$ | $1\times10^{-4}$ | $5\times10^{-4}$ | $6\times10^{-4}$ | 2 | 0.008 | 342 | 2.5 |
| 3 | $2\times10^{-3}$ | $3\times10^{-3}$ | $5\times10^{-3}$ | $2\times10^{-3}$ | $3\times10^{-3}$ | $5\times10^{-3}$ | 2 | 0.038 | 1791 | 2.1 |
| 4 | $5\times10^{-3}$ | $5\times10^{-3}$ | $1\times10^{-2}$ | $5\times10^{-3}$ | $5\times10^{-3}$ | $1\times10^{-2}$ | 2 | 0.050 | 3672 | 0.9 |
| 5 | $1\times10^{-15}$ | $5\times10^{-4}$ | $5\times10^{-4}$ | $1\times10^{-15}$ | $1\times10^{-4}$ | $1\times10^{-4}$ | 3 | 0.005 | 124 | 2.9 |
| 6 | $1\times10^{-20}$ | $1\times10^{-5}$ | $1\times10^{-5}$ | $1\times10^{-20}$ | $1\times10^{-5}$ | $1\times10^{-5}$ | 3 | 0.002 | 0 (no peeling) | 4.1 |
| 7 | $3\times10^{-3}$ | $1\times10^{-2}$ | $1.3\times10^{-2}$ | $3\times10^{-3}$ | $1\times10^{-2}$ | $1.3\times10^{-2}$ | 3 | 0.068 | 12630 | 0.3 |

Although the embodiment and examples of the present invention have been described above, it is originally intended to combine the features of the embodiment and examples described above as appropriate or modify them in various manners.

It should be understood that the embodiment and examples disclosed herein are illustrative and non-restrictive in every respect. The scope of the present invention is defined by the scope of the claims, rather than the embodiment and examples described above, and is intended to include any modifications within the scope and meaning equivalent to the scope of the claims.

REFERENCE SIGNS LIST

10: cutting tool; 11: base material; 12: coating film.

The invention claimed is:

1. A cutting tool comprising:
a base material; and
a coating film covering the base material in contact with the base material,
the base material being a cubic boron nitride sintered material,
the coating film being a ceramic,
an amount of oxygen in the entirety of the coating film being less than or equal to 0.040 mass percent,
the amount of oxygen being measured by using an energy dispersive X-ray analyzer attached to a scanning electron microscope and setting a detection depth of the energy dispersive X-ray analyzer to a distance from a surface of the coating film to an interface between the coating film and the base material.

2. The cutting tool according to claim 1, wherein the amount of oxygen in the coating film is less than or equal to 0.010 mass percent.

3. The cutting tool according to claim 1, wherein
the cubic boron nitride sintered material is composed of more than or equal to 30 volume percent and less than or equal to 90 volume percent of cubic boron nitride, and a remainder including a binder,
the binder is composed of at least one selected from a compound and a solid solution thereof, at least one of Al and an Al compound, and inevitable impurities, the compound being composed of at least one element selected from elements in groups 4, 5, and 6 of a periodic table and Si, and at least one selected from N, C, B, and O,
the coating film has a thickness of more than or equal to 0.05 µm and less than or equal to 5 µm, and
the ceramic includes at least one compound composed of at least one element selected from the elements in groups 4, 5, and 6 of the periodic table, Al, and Si, and at least one selected from C and N.

* * * * *

UNITED STATES PATENT AND TRADEMARK OFFICE
CERTIFICATE OF CORRECTION

PATENT NO. : 11,338,370 B2
APPLICATION NO. : 16/070832
DATED : May 24, 2022
INVENTOR(S) : Katsumi Okamura et al.

It is certified that error appears in the above-identified patent and that said Letters Patent is hereby corrected as shown below:

In the Claims

In Claim 3, Column 14, Lines 13-15, "the binder is composed of at least one selected from a compound and a solid solution thereof, at least one of Al and an Al compound, and inevitable impurities, the" should read --the binder is composed of (i) at least one selected from a compound and a solid solution thereof, (ii) at least one of Al and an Al compound, and (iii) inevitable impurities, the--.

Signed and Sealed this
Thirtieth Day of August, 2022

Katherine Kelly Vidal
*Director of the United States Patent and Trademark Office*